(12) United States Patent
Arning et al.

(10) Patent No.: US 7,272,590 B2
(45) Date of Patent: Sep. 18, 2007

(54) SYSTEM AND METHOD FOR DETERMINING NUMERICAL REPRESENTATIONS FOR CATEGORICAL DATA FIELDS

(75) Inventors: Andreas Arning, Rottenburg (DE); Christoph Lingenfelder, Herrenberg (DE); Gregor Meyer, Loeningen (DE); Dieter Roller, Schoenaich (DE); Swen Wohland, Bischofswerda (DE)

(73) Assignee: International Business Machines Corporation, Armonk, NY (US)

( * ) Notice: Subject to any disclaimer, the term of this patent is extended or adjusted under 35 U.S.C. 154(b) by 942 days.

(21) Appl. No.: 10/383,182

(22) Filed: Mar. 6, 2003

(65) Prior Publication Data

US 2003/0204483 A1 Oct. 30, 2003

(30) Foreign Application Priority Data

Apr. 26, 2002 (EP) .................................. 02009573

(51) Int. Cl.
*G06F 17/30* (2006.01)
(52) U.S. Cl. .......................................... 707/2; 707/101
(58) Field of Classification Search .................... 707/1, 707/3, 5, 101; 382/116; 700/31
See application file for complete search history.

(56) References Cited

U.S. PATENT DOCUMENTS

2003/0176931 A1* 9/2003 Pednault et al. .............. 700/31

OTHER PUBLICATIONS

H. Ralambondrainy, "A Conceptual Version of the K-Means Algorithm," Pattern Recognition Letters 16, 1995, pp. 1147-1157.

* cited by examiner

*Primary Examiner*—Apu M. Mofiz
(74) *Attorney, Agent, or Firm*—Samuel A. Kassatly

(57) ABSTRACT

A system and method determine numerical representations for categorical data fields by taking advantage of the redundancy of the data records to allow automatic discovery of an order of the categories. A categorical data field is recoded by creating separate tables for each numerical data field occurring in the data records. The separate tables are sorted according to the numerical values of the respective data fields. The recoding of the categories is performed based on the average sort order of occurrences of the category in a specific sorted table. The standard deviation of the numerical codes provided by the categories is calculated for each of the separate recoding tables. The recoding table with the maximum standard deviation is selected as the recoding table to perform the recoding of the categories contained in the respective categorical data field of the data records. A plausibility check is performed for the selected recoding table by excluding the numerical data field that has formed the basis for the sorting of the respective table and recreating the recoding table from the data records. The resulting recoding table and the original recoding table are compared. Resulting recoding tables that are similar indicate a high level of confidence that the originally selected recoding table is optimal.

40 Claims, 3 Drawing Sheets

| TEST PERSON ID | CLOTHES SYMBOL | PERSON'S WEIGHT (KG) | PERSON'S HEIGHT (CM) |
|---|---|---|---|
| A | L | 70 | 174 |
| B | XXL | 100 | 194 |
| C | L | 90 | 180 |
| D | XL | 88 | 178 |
| E | L | 79 | 176 |
| F | XXL | 89 | 195 |
| G | XL | 78 | 188 |
| H | XL | 75 | 183 |
| I | L | 73 | 175 |
| J | XXL | 91 | 192 |

FIG. 2

| RECORD INDEX | TEST PERSON ID | CLOTHES SYMBOL | PERSON'S WEIGHT (KG) |
|---|---|---|---|
| 1 | A | L | 70 |
| 2 | I | L | 73 |
| 3 | H | XL | 75 |
| 4 | G | XL | 78 |
| 5 | E | L | 79 |
| 6 | D | XL | 88 |
| 7 | F | XXL | 89 |
| 8 | C | L | 90 |
| 9 | J | XXL | 91 |
| 10 | B | XXL | 100 |

L → 4.00
XL → 4.33
XXL → 8.67

FIG. 3

| RECORD INDEX | TEST PERSON ID | CLOTHES SYMBOL | PERSON'S HEIGHT (CM) |
|---|---|---|---|
| 1 | A | L | 174 |
| 2 | I | L | 175 |
| 3 | E | L | 176 |
| 4 | D | XL | 178 |
| 5 | C | L | 180 |
| 6 | H | XL | 183 |
| 7 | G | XL | 188 |
| 8 | J | XXL | 192 |
| 9 | B | XXL | 194 |
| 10 | F | XXL | 195 |

L → 2.75
XL → 5.67
XXL → 9.00

SYSTEM AND METHOD FOR DETERMINING NUMERICAL REPRESENTATIONS FOR CATEGORICAL DATA FIELDS

PRIORITY CLAIM

The present application claims the priority of European patent application, Serial No. 02009573.3, titled "A Method For Determining Numerical Representations For Categorical Data Fields And Data Processing System," which was filed on Apr. 26, 2002, and which is incorporated herein by reference.

FIELD OF THE INVENTION

The present invention relates to the field of data processing, and it more particularly relates to the processing of data records comprising categorical and numerical data fields.

BACKGROUND OF THE INVENTION

Conventional data analysis techniques perform well when all of the data attributes or features are of numerical type, that is all the data points of the data set have only numerical (continuous) attributes. For example, most neural network algorithms and most regression algorithms are restricted to data points with numerical data attributes.

H. Ralambondrainy, "A Conceptual Version of the K-Means Algorithm," Pattern Recognition Letters 16, 1995, pp. 1147–1157, discloses a data clustering technique for converting data having categorical attributes to 1-of-p representations that are then combined with data of the same data set having real attributes. The combined 1-of-p representations and real attributes are used directly in a clustering algorithm such as the k-means algorithm.

Typically, data records comprising both categorical data fields and numerical data fields are processed in one of two methods.

A given categorical data field has a number of m different categories. The first approach recodes the m different categories by mapping the m categories to corresponding m new binary columns. In these new binary columns, exactly one column has the code "1" for the actual value of the category and the others have the code "0".

The second approach arbitrarily recodes the categorical values as numbers, e.g. by encoding the first category as "1" the next category "2", and so on.

Both of these methods have severe disadvantages. Introducing a number of m new binary columns can create a very large number of additional data fields in the records, making it difficult for most analysis methods to process the records.

In addition, arbitrarily recoding the categorical values introduces inadequate relations between the values. This arbitrary recoding introduces an implied small distance between the first occurring value and the second occurring value and an implied large distance between the first occurring value and the last occurring value. Consequently, arbitrarily recoding the categorical values leads to an incorrect analysis as the arbitrarily assigned numbers suggest similarities or dissimilarities between the categories when such similarities do not exist.

There is therefore a need for a system and an associated method that efficiently and accurately determine numerical representations for categories of categorical data fields. The need for such system and method has heretofore remained unsatisfied.

SUMMARY OF THE INVENTION

The present invention satisfies this need, and presents a system, a computer program product, and an associated method (collectively referred to herein as "the system" or "the present system") for determining numerical representations for categorical data fields. The present system takes advantage of the redundancy of the data records, to allow automatic discovery of an order of the categories. Consequently, incorrect analytical results are avoided since information that does not correspond to the real properties of the data is not introduced into the data records.

In accordance with a preferred embodiment of the present system, a categorical data field is recoded by creating separate tables for each numerical data field occurring in the data records. These separate tables are sorted according to the numerical values of the respective data fields. The recoding of the categories is performed based on the average sort order of occurrences of the category in a specific sorted table. Consequently, a set of coding tables for the categories is created for each of the separate tables.

The standard deviation of the numerical codes provided by the categories is calculated for each of the separate recoding tables. The recoding table with the maximum standard deviation is selected as the basis for performing the recoding of the categories contained in the respective categorical data field of the data records. The present system can employ this method with respect to each of the categorical data fields to obtain a separate optimized recoding table for each of the categorical data fields.

The present system provides a data basis for performing an analytical method such as data clustering, predictive data analysis, factor analysis, principle component analysis, neural network techniques or other kinds of statistical analysis.

In accordance with a further preferred embodiment of the present system, a plausibility check is performed for the selected recoding table. This is performed by excluding the numerical data field that has formed the basis for the sorting of the respective table to create the recoding table from the data records.

Based on the data records with this excluded numerical data column, the method of the present system is performed again. The resulting recoding table and the original recoding table are compared. Resulting recoding tables that are similar indicate a high level of confidence that the originally selected recoding table is optimal.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 2 is a table exemplifying a set of data records having a categorical data field and numerical data fields;

FIG. 3 is a table illustrating a table created for the numerical data field "person's weight" and the resulting recoding table;

DETAILED DESCRIPTION OF PREFERRED EMBODIMENTS

Figure 1:
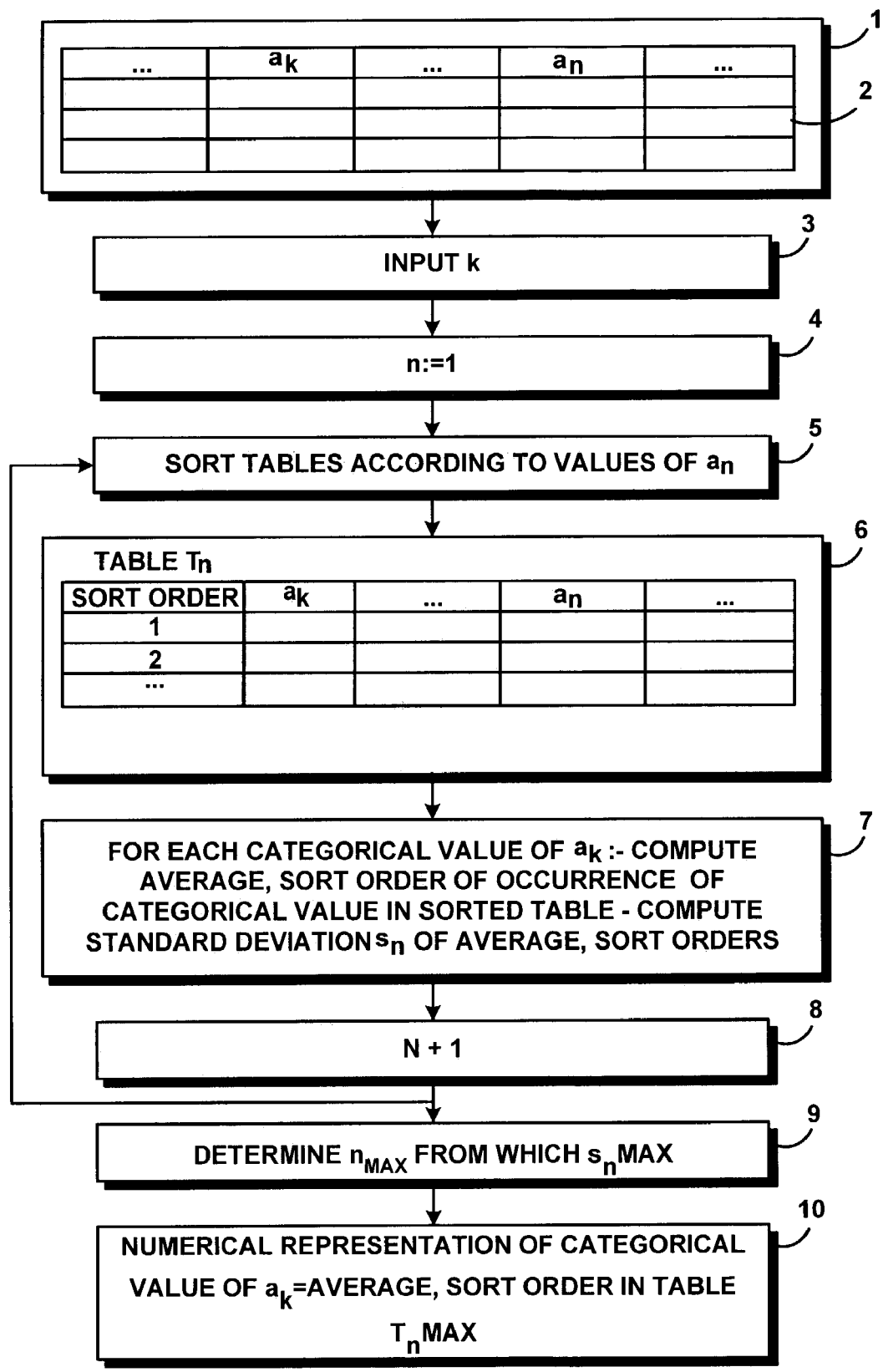
FIG. 1 is a process flow chart illustrating a method for determining numerical representations according to the present invention.

FIG. 1 is a flow chart illustrating the method for determining numerical representations for categories of categorical data fields. In step 1, a table 2 is entered. The table 2 has a number of data records. Each of the data records has at least one categorical data field for attributes $a_k$ and a number of N numerical data fields with attributes $a_n$, where n ranges from 2 to N.

In step 3, the categorical data field of the table 2 to be recoded is specified by entering the index k. In step 4, the index n is initialized by setting the index n to 1. The numerical data fields of the column for attributes $a_1$ of the table 2 are now selected.

In step 5, the table 2 is sorted according to the numerical values of the data fields $a_n$. The result of the sorting operation is output in step 6. The table 2 which has been sorted with respect to the numerical attributes $a_n$ is designated as $T_n$.

In step 7, the average sort order of occurrence of a specific categorical value is computed. This computation is performed for each of the categories of the categorical data field $a_k$. Consequently, a recoding table is created whereby each of the categories is recoded by its average sort order within the table $T_n$.

Next, the standard deviation $s_n$ of the numerical codes assigned to the categories in the recoding table is calculated. Alternatively another statistical measure can be calculated and used instead of the standard deviation $s_n$.

In step 8, the index n is incremented and the control returns to step 5 to sort the table 2 according to the numerical values of the attributes $a_n$. Another recoding table and another standard deviation $s_n$ has now been obtained. This processing loop continues for all values of n.

In step 9, the maximum standard deviation $s_n$ max of the standard deviations $s_n$ which have been computed in step 7 is determined. In this manner, the recoding table corresponding to the maximum standard deviation $s_n$ max is selected. This corresponds to a choice of one of the numerical data fields $a_n$ max.

In step 10, the recoding table containing the numerical representations of the categorical values is output. Each of the numerical representations is the average sort order of the corresponding category in the table $T_n$ max.

Figures 4, 5:
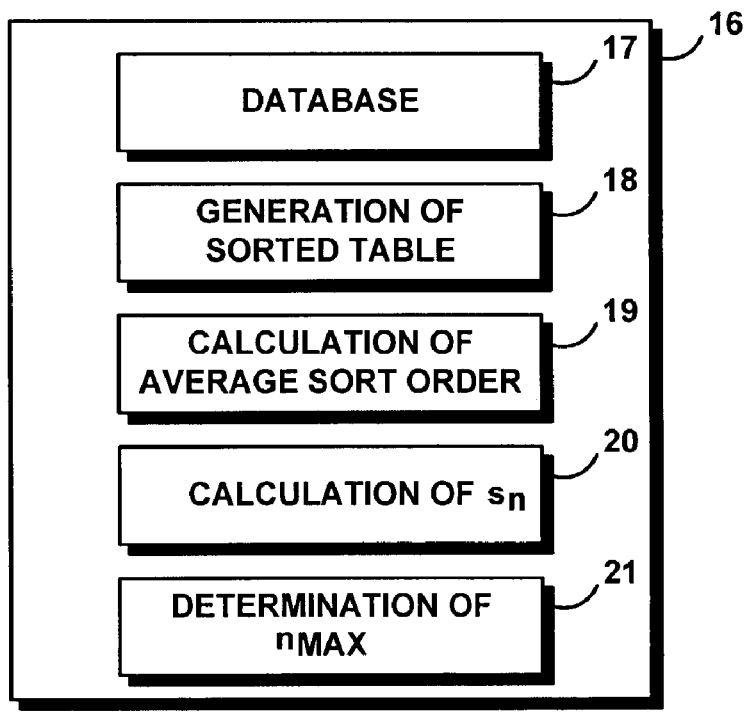
FIG. 4 is a table illustrating a table that has been created for the numerical data field "person's height" and the resulting recoding table.
FIG. 5 is a block diagram illustrating a high-level architecture of an embodiment of a data processing system in accordance with the present invention.

The above described procedure is illustrated by way of example with respect to the following FIGS. 2, 3 and 4.

FIG. 2 shows a table 11 with records having different kinds of attributes. Each record contains a data field for an identifier of a test person to which the record is assigned "test person ID". Further, each record has a categorical data field for the person's size that is indicated by the clothes symbol. The clothes symbol can have the categorical values of "L", "XL" or "XXL".

Each record also has a numerical data field for the test person's weight "person's weight (kg)" and a numerical data field for the test person's height "person's height (cm)". To perform an analysis of the table 11, the categories of the categorical data field "clothes symbol" must be recoded into numerical values. This recoding is performed by creating separate tables for each of the numerical data columns in the data table 11.

FIG. 3 shows a table 12 that has been created for the numerical data fields "person's weight (kg)". The records contained in the table 11 of FIG. 2 have been sorted according to the value in the data fields "person's weight (kg)". A record index is assigned to each of the records corresponding to the order of the sorted records. In this example, the record for the test person with the lowest weight has the record index "1", the record for the test person with the second lowest weight has the record index "2" and so on. The heaviest test person record has the record index "10" because there are ten records.

For each of the categorical values "L", "XL" and "XXL", a numerical representation is calculated. This calculation is performed by identifying the occurrence of a given categorical value within the table 12 and then calculating the average of the record indices of those records containing the categorical value. For example, the records having the record indices "1", "2", "5" and "8" are identified as records containing the categorical value of "L".

The average of the record indices of those records, i.e. the average of 1, 2, 5 and 8, is 4.00. Likewise corresponding average values are calculated for "XL" and "XXL". In this example, the numerical representation of "XL" is 4.33 and the numerical representation of "XXL" is 8.67. In this manner, recoding table 13 is established.

FIG. 4 shows a table 14 that corresponds to table 12 of FIG. 3. Table 14 is sorted with respect to the numerical data fields "person's height".

Again the occurrences of categorical values within the records of the sorted table 14 are determined and the average record indices are calculated to compute numerical representations for each of the categorical values. An alternative recoding table 15 is now determined.

The standard deviations for the numerical representations of the recoding tables 13 and 15 are now calculated. The standard deviation of 4.00; 4.33 and 8.67 (table 13) is 2.61 whereas the standard deviation of 2.75; 5.67 and 9.00 (table 15) is 3.12.

In this example, the standard deviation of the numerical representations contained in the coding table 15 is the maximum standard deviation of all recoding tables that have been established. Consequently, the recoding table 15 is selected for recoding of the categorical values within the table 11 (FIG. 2).

The table 11 with the recoded categorical values for "clothes symbol" can be analyzed by means of any analytical method such as data mining or data clustering.

Optionally, a plausibility test can be performed on the performance of the recoding before the final selection of the recoding table. This plausibility test compares the ordering of the categorical values in the respective recoding tables that are sorted based on the numerical representations. When the results of the plausibility test matches the original ordering, a high degree of confidence is provided that the numerical representation is reflecting a real property of the person.

FIG. 5 is a block diagram illustrating the high-level architecture of a corresponding data processing system 16. The data processing system 16 has a database 17 for storage of a number of records such as table 2 (cf. FIG. 1). Further, the data processing system has a program module 18 for sorting the table of database 17, tables $T_n$ (cf. step 6 of FIG. 1).

Further, the data processing system 16 has a program module 19 for calculating an average sort order, corresponding to the computation performed in step 7 of FIG. 1.

A program module 20 calculates the standard deviation $s_n$ (step 7 of FIG. 1).

The program module 21 determines the index n for which the standard deviation $s_n$ has a maximum. From the maximum standard deviation, the set of average sort orders calculated by program module 19 is selected for the recoding.

Furthermore, the data processing system 16 can have a program module for performing a deviation detection based on the numerical representations. This deviation detection can be performed by comparing the numerical representation of a category of a categorical data field of a record with its sort order. Considering the above example again, a record which has the value "L" together with "person's height" of 195 can thus be automatically detected and flagged for further inspection.

It is to be understood that the specific embodiments of the invention that have been described are merely illustrative of certain application of the principle of the present invention. Numerous modifications may be made to a method for determining numerical representations for categorical data fields and data processing system invention described herein without departing from the spirit and scope of the present invention.

What is claimed is:

1. A computer-implemented method for determining numerical representations for data records that include a categorical field and numerical data fields, the method comprising:
    creating tables for at least two of the numerical data fields;
    sorting the records in each of the created tables with respect to corresponding numerical data fields;
    computing a set of average sort orders of an occurrence of categories of categorical data fields and data records for each table;
    computing a statistical measure for the set of average sort orders;
    determining a maximum statistical measure of the statistical measure;
    selecting the set of average sort orders with the maximum statistical measure; and
    setting the set of average sort orders that have been selected as a base for numerical recoding.

2. The method of claim 1, further comprising normalizing the numerical recoding.

3. The method of claim 1, wherein creating the tables comprises creating a separate table for each of the numerical data fields.

4. The method of claim 2, further comprising sorting each of the created tables with respect to corresponding numerical data fields.

5. The method of claim 2, further comprising computing a set of sort orders for each table.

6. The method of claim 5, further comprising computing statistical measures for each sort order.

7. The method of claim 5, further comprising excluding from the data records, the numerical data field that corresponds to the selected set of average sort orders.

8. The method of claim 7, wherein creating the tables comprises creating a separate table for each numerical data field with the exception of the numerical data field that has been excluded.

9. The method of claim 8, further comprising sorting each table with respect to the numerical data field for which the table was created.

10. The method of claim 8, further comprising computing statistical measures for each sort order.

11. The method of claim 8, further comprising comparing a first numerical representation obtained by excluding the numerical data field from the data records with a second numerical representation obtained before excluding the data field.

12. The method of claim 11, further comprising performing a plausibility check so that the first and second numerical representations are similar.

13. The method of claim 11, further comprising performing a deviation detection based on the first and second numerical representations.

14. A computer-implemented method for determining numerical representations for categories of a categorical data field of data records, the data records comprising a categorical field and a plurality of numerical data fields, the method comprising:
    creating a first table for a first numerical data field;
    creating a second table for a second numerical data field;
    computing a first set of average sort orders of an occurrence of the categories in the first table and computing a second set of sort orders of occurrence of the categories in second table;
    computing a first statistical measure for the first set of average sort orders;
    computing a second statistical measure for the second set of average sort orders;
    determining a maximum of the first and second statistical measures;
    selecting the set of average sort orders with the maximum statistical measure; and
    setting the set of average sort orders that have been selected as a base for numerical recoding.

15. The method of claim 14, further comprising refining the numerical recoding by means of a normalization process.

16. The method of claim 15, wherein creating the first table comprises creating a separate table for each of the numerical data fields.

17. The method of claim 16, further comprising sorting each separate table with respect to corresponding numerical data fields.

18. The method of claim 17, further comprising computing a set of sort orders for the separate table.

19. The method of claim 18, further comprising computing statistical measures for each sort order.

20. The method of claim 19, further comprising excluding from the data records, the numerical data field that corresponds to the selected set of average sort orders.

21. A computer program product having instruction codes embodied on a computer-readable medium, for determining numerical representations for data records that include a categorical field and numerical data fields, the computer program product comprising:
    a first set of instruction codes for creating tables for at least two of the numerical data fields;
    a second set of instruction codes for sorting the records in each of the created tables with respect to corresponding numerical data fields;
    a third set of instruction codes for computing a set of average sort orders of an occurrence of categories of categorical data fields and data records for each table;
    the third set of instruction codes further computing a statistical measure for the set of average sort orders;
    a fourth set of instruction codes for determining a maximum statistical measure of the statistical measure;
    a fifth set of instruction codes for selecting the set of average sort orders with the maximum statistical measure; and a sixth set of instruction codes for setting the set of average sort orders that have been selected as a base for numerical recoding.

22. The computer program product of claim 21, further comprising a seventh set of instruction codes for normalizing the numerical recoding.

23. The computer program product of claim 21, wherein the first set of instruction codes creates a separate table for each of the numerical data fields.

24. The computer program product of claim 22, further comprising an eight set of instruction codes for sorting each of the created tables with respect to corresponding numerical data fields.

25. The computer program product of claim 22, further comprising a ninth set of instruction codes for computing a set of sort orders for each table.

26. The computer program product of claim 25, wherein the ninth set of instruction codes further computes statistical measures for each sort order.

27. The computer program product of claim 25, wherein the fifth set of instruction codes further excludes from the data records, the numerical data field that corresponds to the selected set of average sort orders.

28. The computer program product of claim 27, wherein the first set of instruction codes further creates a separate table for each numerical data field with the exception of the numerical data field that has been excluded.

29. The computer program product of claim 28, further comprising a tenth set of instruction codes for sorting each table with respect to the numerical data field for which the table was created.

30. The computer program product of claim 28, further comprising an eleventh set of instruction codes for computing statistical measures for each sort order.

31. A system for determining numerical representations for data records that include a categorical field and numerical data fields, the system comprising:
   means for creating tables for at least two of the numerical data fields;
   means for sorting the records in each of the created tables with respect to corresponding numerical data fields;
   means for computing a set of average sort orders of an occurrence of categories of categorical data fields and data records for each table;
   the computing means further computing a statistical measure for the set of average sort orders;
   means for determining a maximum statistical measure of the statistical measure;
   means for selecting the set of average sort orders with the maximum statistical measure; and
   means for setting the set of average sort orders that have been selected as a base for numerical recoding.

32. The system of claim 31, further comprising means for normalizing the numerical recoding.

33. The system of claim 31, wherein the creating means creates a separate table for each of the numerical data fields.

34. The system of claim 32, further comprising means for sorting each of the created tables with respect to corresponding numerical data fields.

35. The system of claim 32, further comprising means for computing a set of sort orders for each table.

36. The system of claim 35, wherein the means for computing the set of sort orders further computes statistical measures for each sort order.

37. The system of claim 35, wherein the means for selecting the set of average sort orders with the maximum statistical measure further excludes from the data records, the numerical data field that corresponds to the selected set of average sort orders.

38. The system of claim 37, wherein the means for creating tables further creates a separate table for each numerical data field with the exception of the numerical data field that has been excluded.

39. The system of claim 38, further comprising means for sorting each table with respect to the numerical data field for which the table was created.

40. The system of claim 38, further comprising means for computing statistical measures for each sort order.

* * * * *